US006248178B1

(12) United States Patent
Tsai et al.

(10) Patent No.: US 6,248,178 B1
(45) Date of Patent: Jun. 19, 2001

(54) METHOD FOR REMOVING PAD NODULES

(75) Inventors: Cheng-Tzung Tsai, Taipei; Cheng-Chih Kung, Miaoli; Lien-Sheng Chung, Hsinchu; Tai-Yuan Li, Taipei, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/542,665

(22) Filed: Apr. 4, 2000

(30) Foreign Application Priority Data

Mar. 30, 2000 (TW) ................................................ 89105908

(51) Int. Cl.[7] ........................................................ B08B 7/04
(52) U.S. Cl. .......................... 134/2; 134/19; 134/22.17; 134/25.4; 134/26; 134/29; 134/30; 134/34; 134/35; 134/36; 134/42; 134/902; 510/175; 510/435; 216/99; 216/102
(58) Field of Search .......................... 134/2, 19, 22.17, 134/25.4, 26, 29, 30, 34, 35, 36, 42, 902; 510/175, 435; 216/99, 102

(56) References Cited

U.S. PATENT DOCUMENTS

| | | | |
|---|---|---|---|
| 5,824,234 | * 10/1998 | Jou et al. ................................ | 216/18 |
| 5,904,156 | *  5/1999 | Advocate, Jr. et al. ................ | 134/2 |
| 5,980,643 | * 11/1999 | Jolley ..................................... | 134/2 |
| 5,989,353 | * 11/1999 | Skee et al. ............................. | 134/2 |

* cited by examiner

*Primary Examiner*—Sharidan Carrillo
(74) *Attorney, Agent, or Firm*—Thomas, Kayden, Horstemeyer & Risley

(57) ABSTRACT

A method is disclosed for removing pad nodules. The method provides a wafer comprising pads and pad nodules which are formed on said pads, wherein said pads are made from a metal selected from the group consisting of aluminum and an aluminum-copper alloy. Then, the method dips the wafer into deionized water for removing the pad nodules. Thereafter, the method spin-dries the wafer and coats an alkaloid developer on the wafer for further removing the pad nodules. Finally, the method removes the alkaloid developer from the wafer and bakes the wafer.

9 Claims, 3 Drawing Sheets

METHOD FOR REMOVING PAD NODULES

CROSS-REFERENCE TO RELATED APPLICATION

This application claims the priority benefit of Taiwan application serial no. 89105908, filed Mar. 30, 2000.

BACKGROUND OF THE INVENTION

1. Field of Invention

The present invention relates to a method for removing pad nodules. More particularly, the present invention relates to a method for removing pad nodules utilizing deionized water and developer.

2. Description of Related Art

Pads which are made of aluminium or aluminium/copper alloy are formed on a wafer for bonding and testing. An etching process such as plasma etching is performed for forming the pads. If chloride plasma is utilized in the etching process, a corrosion effect is generated. To avoid the corrosion effect, fluorine plasma is utilized. However, fluorine easily remains on the pads after the plasma process and then pad nodules (as shown in FIG. 1) are formed on the pads because fluorine remains on the pads reacts with the pads to produce $AlF_3$. The pad nodules affect the reliability of the subsequently formed devices.

A wet rinse process is usually performed after the plasma etching process to remove fluorine remains on the pads. But fluorine is difficult to be completely removed, although the wet rinse process is performed. Therefore, an oxygen plasma process may be performed to help removal of fluorine, but the oxygen plasma process also affects the reliability of the subsequently formed devices.

SUMMARY OF THE INVENTION

The invention provides a method for removing pad nodules, which method effectively removes the pad nodules by utilizing deionized water and developer.

The invention provides a method for removing pad nodules that the method is simply implemented and suitable for the conventional facilities.

The invention provides a method for removing fluorine remains on pads. In accordance with the method, fluorine remains on pads is effectively removed; thus, generation of pad nodules is avoided.

As embodied and broadly described herein, the invention provides a method for removing pad nodules. A wafer having pads formed with pad nodules is dipped into deionized water. Then, the wafer is spin-dried. An alkaloid developer is coated on the wafer; next, the developer is removed. The wafer is baked.

The present invention provides a method for removing fluorine remains on pads. A wafer having pads is dipped into deionized water, and then the wafer is spin-dried. An alkaloid developer is coated on the wafer; next, the developer is removed. The wafer is baked.

The method disclosed in this invention effectively removes pad nodules. Moreover, the method is simply implemented and suitable for the conventional facilities. In addition, generation of pad nodules is avoided by utilizing this method to remove fluorine remains on pads after the etching process.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

The invention provides a method for removing pad nodules, which method effectively removes the pad nodules by utilizing deionized water and developer. Moreover, this invention effectively removes fluorine remains on the pads to avoid generation of pad nodules.

When pads are formed on a wafer by utilizing an etching process such as fluorine plasma etching, fluorine remains on the pads after the etching process. Furthermore, pad nodules are easily formed because fluorine remains on the pads reacts with the pads.

To remove the pad nodules, the wafer is dipped into deionized water. The deionized water is preferably about 60~80° C., and the duration of dipping the wafer into the deionized water is preferably about 30 minutes. Next, the wafer is spin-dried. Developer is coated on the wafer. The developer is preferably alkaloid, and preferably is TMAH whose weight percentage is about 2.38% in this invention. The developer is removed, and then the wafer is baked.

Figure 1:
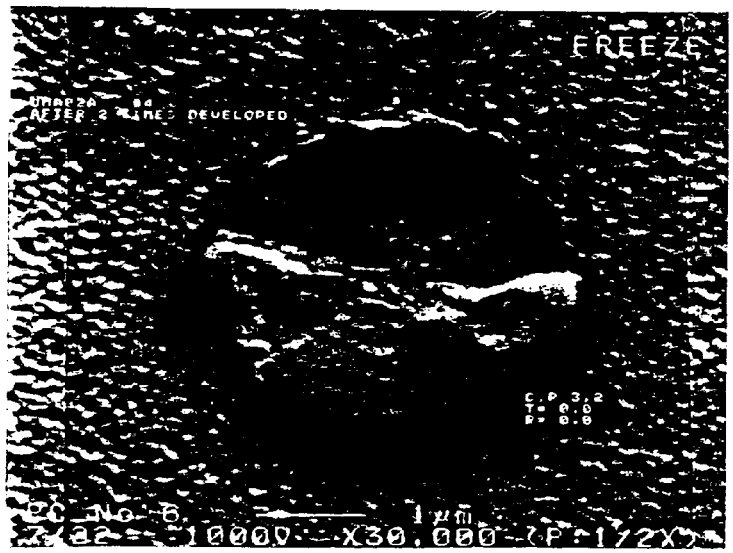
FIG. 1 is a top view of a pad nodule which is not processed as is known in the prior art.
Figure 2:
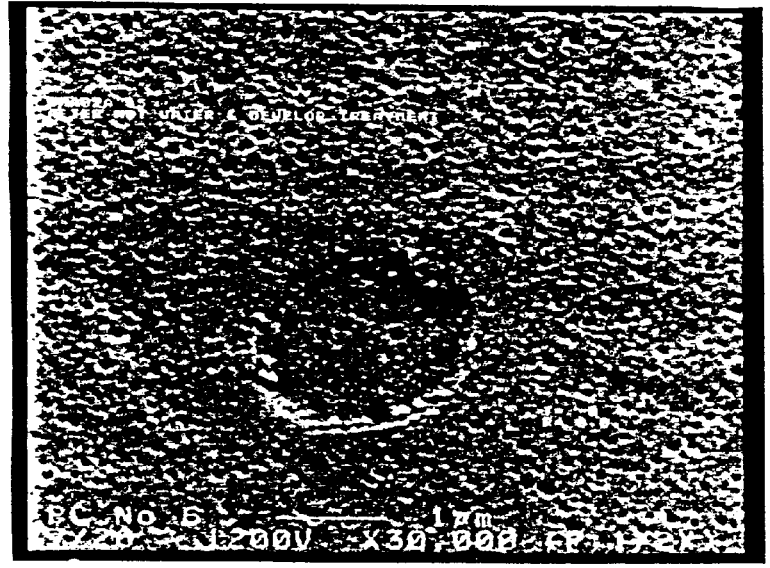
FIG. 2 is a top view of a pad nodule processed according to one preferred embodiment of this invention.
Figure 3:
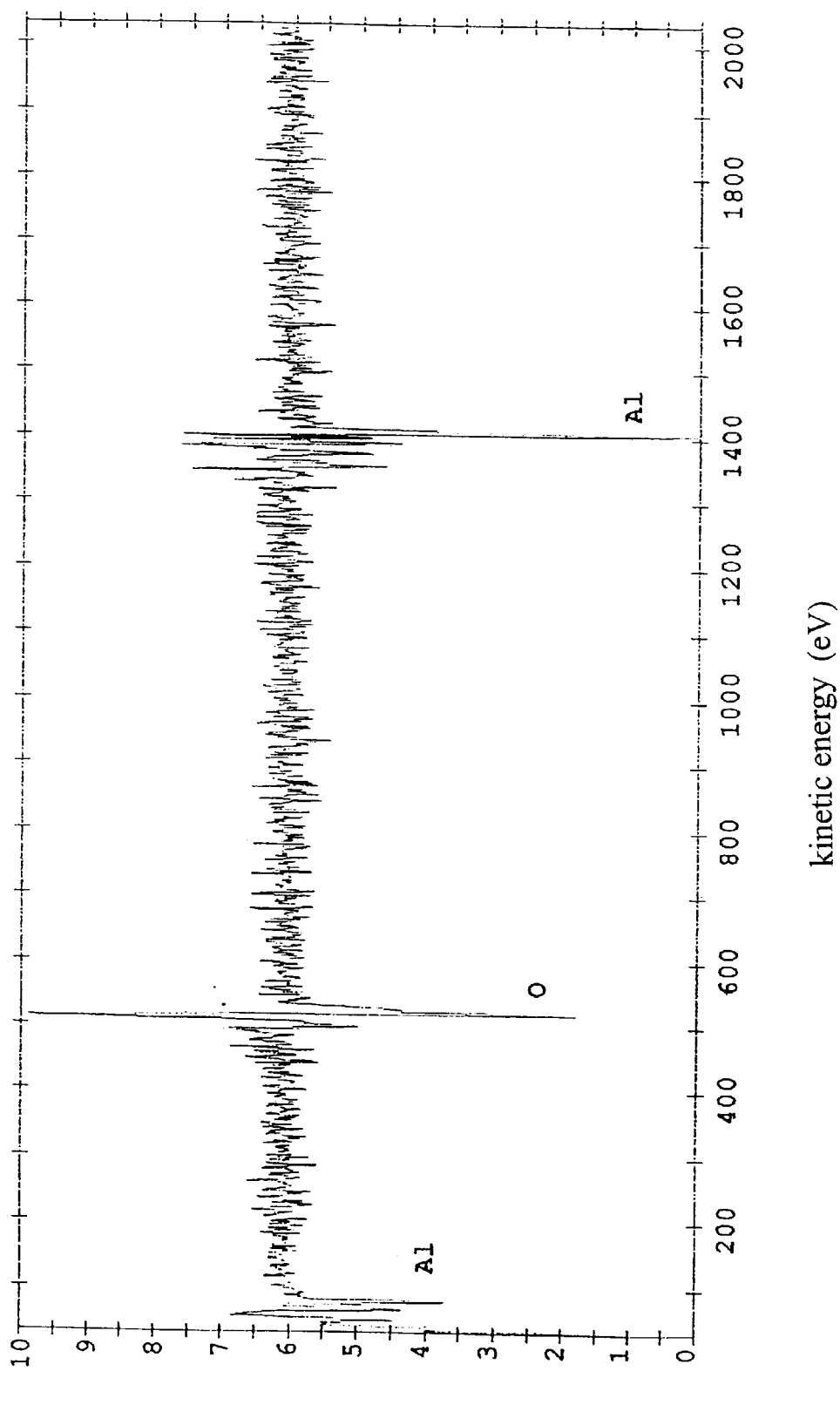
FIG. 3 is an Auger analysis diagram of the pad nodule processed according to one preferred embodiment of this invention.
Figure 4:
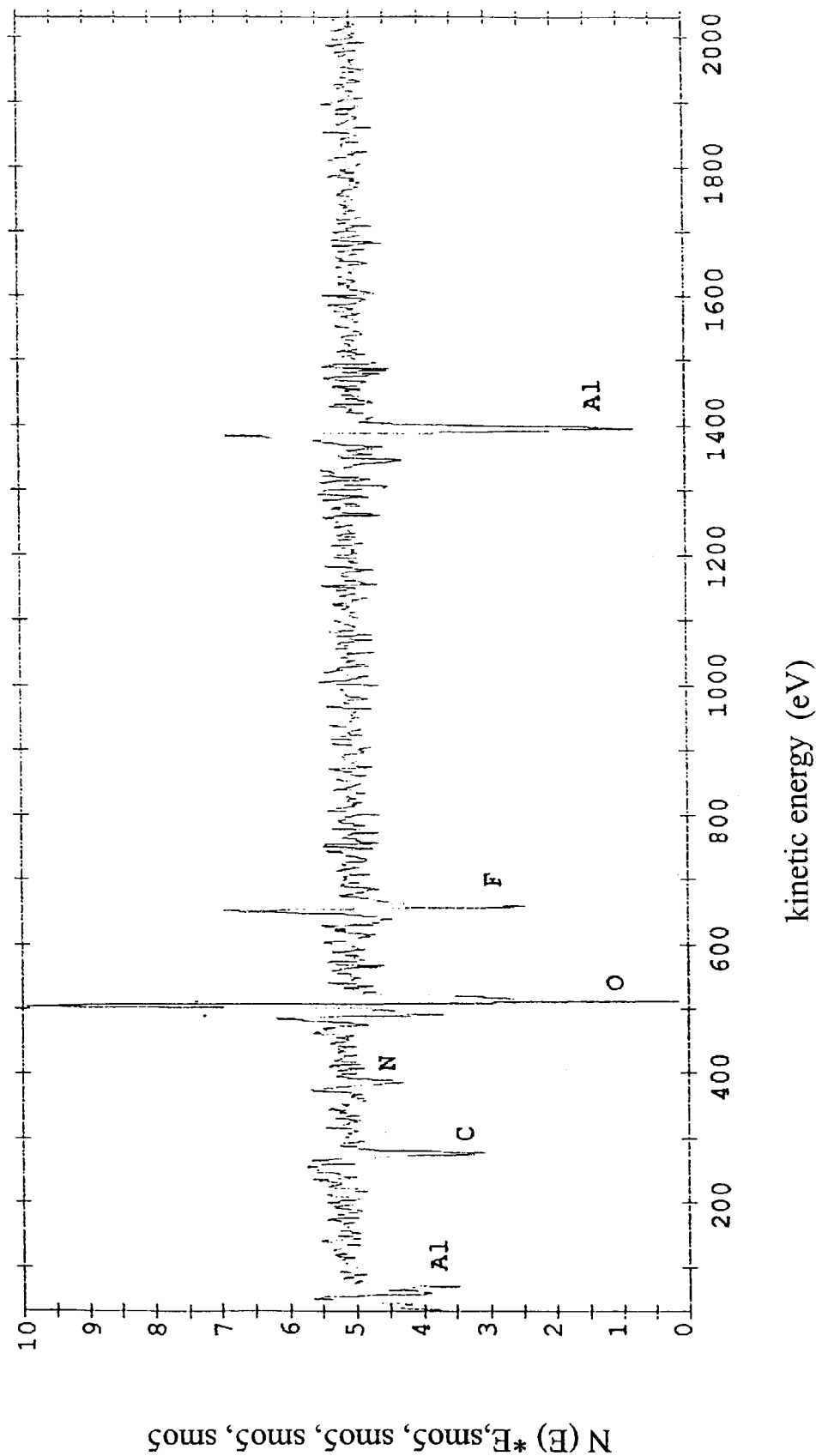
FIG. 4 is an Auger analysis diagram of the pad nodule which is not processed.

As shown in FIG. 2, the pad nodule processed according to the invention is removed. Furthermore, as comparing FIG. 3 and FIG. 4, no fluorine remains on the pads after performing the method in accordance with this invention. Therefore, generation of the pad nodules is avoided.

The method disclosed in this invention effectively removes pad nodules. Moreover, the method is simply implemented and suitable for the conventional facilities. In addition, generation of pad nodules is avoided by utilizing this method to remove fluorine remains on pads.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for removing pad nodules comprising the sequential steps of:

providing a wafer comprising pads and pad nodules which are formed on said pads, wherein said pads are made from a metal selected from the group consisting of aluminum and an aluminum-copper alloy;

dipping the wafer into deionized water for removing the pad nodules;

spin-drying the wafer;

coating an alkaloid developer on the wafer for further removing the pad nodules;

removing the alkaloid developer from the wafer; and baking the wafer.

2. The method of claim 1, wherein the deionized water has a temperature of about 60~80° C.

3. The method of claim 1, wherein step of dipping the wafer into the deionized water includes dipping the wafer into the deionized water for a duration of about 30 minutes.

4. The method of claim 1, wherein the alkaloid developer includes tetramethylammonium hydroxide (TMAH) whose weight percentage is about 2.38%.

5. A method for removing fluorine residue that remains on a wafer after an etching process, the method comprising the sequential steps of:

provic a wafer with pads formed thereon, wherein said pads are made from a metal selected from a group consisting of aluminum and an aluminum-copper alloy;

etching said wafer to produce fluorine residue on said pads;

dipping the wafer into deionized water to remove said fluorine residue on the wafer;

spin-drying the wafer;

coating an alkaloid developer on the wafer for further removing said fluorine residue;

removing the alkaloid developer from the wafer; and baking the wafer.

6. The method of claim 5, wherein the deionized water has a temperature of about 60~80° C.

7. The method of claim 5, wherein a duration of dipping the wafer into the deionized water is about 30 minutes.

8. The method of claim 5, wherein the alkaloid developer includes tetramethylammonium hydroxide (TMAH).

9. The method of claim 8, wherein the TMAH has a weight percentage of about 2.38%.

* * * * *